(12) United States Patent
Li et al.

(10) Patent No.: US 12,740,334 B2
(45) Date of Patent: Sep. 15, 2026

(54) PHASE CHANGE MEMORY CELL SIDEWALL HEATER

(71) Applicant: International Business Machines Corporation, Armonk, NY (US)

(72) Inventors: Juntao Li, Cohoes, NY (US); Kangguo Cheng, Schenectady, NY (US); Carl Radens, LaGrangeville, NY (US); Ching-Tzu Chen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 883 days.

(21) Appl. No.: 17/934,212

(22) Filed: Sep. 22, 2022

(65) Prior Publication Data

US 2024/0107900 A1 Mar. 28, 2024

(51) Int. Cl.

*H10N 70/20* (2023.01)
*H10B 63/00* (2023.01)
*H10N 70/00* (2023.01)

(52) U.S. Cl.

CPC ........... *H10N 70/231* (2023.02); *H10B 63/80* (2023.02); *H10N 70/023* (2023.02); (Continued)

(58) Field of Classification Search

CPC ................ H10B 70/231; H10B 70/883; H10B 70/8413; H10B 70/8613; H10B 70/063; H10B 70/023; H10B 70/882; H10B 63/80

(Continued)

(56) References Cited

U.S. PATENT DOCUMENTS 6,589,714 B2 7/2003 Maimon et al.
6,972,430 B2 12/2005 Casagrande (Continued)

FOREIGN PATENT DOCUMENTS

CN 102332530 A 1/2012
CN 102544363 A 7/2012

(Continued)

OTHER PUBLICATIONS

International Searching Authority, "Notification of Transmittal of the International Search Report and the Written Opinion of the International Searching Authority, or the Declaration", File Reference IEE230081PCT, International application No. PCT/CN2023/094948, International Filing Date May 18, 2023, Mailed on Jun. 19, 2023, 7 pages.

(Continued)

*Primary Examiner* — Sung Il Cho
(74) *Attorney, Agent, or Firm* — Kimberly Zillig

(57) ABSTRACT

A phase change memory structure with improved sidewall heater and formation thereof may be presented. Phase change materials are capable of being switched between a first structural state in which the material is in a generally amorphous solid phase, and a second structural state in which the material is in a generally crystalline solid phase in the active region of the cell. Presented herein may be a side wall heater, where the upper section extends through bilayer dielectric to contact a phase change material layer and the lower section of the sidewall heater has conductive layers in contact with the bottom electrode. The width of the sidewall heater may reflect an inverted T shape reducing the current requirement to reset the phase change material.

9 Claims, 13 Drawing Sheets

(52) U.S. Cl.
CPC ....... *H10N 70/063* (2023.02); *H10N 70/8413* (2023.02); *H10N 70/8613* (2023.02); *H10N 70/882* (2023.02); *H10N 70/883* (2023.02)

(58) Field of Classification Search
USPC .......................................................... 365/163
See application file for complete search history.

(56) References Cited

U.S. PATENT DOCUMENTS

| | | | | |
|---|---|---|---|---|
| 7,687,794 | B2 | 3/2010 | Liu | |
| 7,825,398 | B2 | 11/2010 | Happ | |
| 8,497,182 | B2 | 7/2013 | Lung | |
| 10,490,742 | B2 | 11/2019 | Tsai | |
| 10,636,968 | B2 | 4/2020 | Horii et al. | |
| 2002/0045323 | A1 | 4/2002 | Lowrey et al. | |
| 2009/0057640 | A1* | 3/2009 | Lin | H10N 70/8828 257/E47.001 |
| 2009/0146127 | A1 | 6/2009 | Huang | |
| 2011/0001114 | A1 | 1/2011 | Zanderighi et al. | |
| 2011/0057162 | A1* | 3/2011 | Breitwisch | H10N 70/884 438/102 |
| 2012/0068147 | A1 | 3/2012 | Chuang | |
| 2013/0306931 | A1 | 11/2013 | Lung | |
| 2014/0117302 | A1 | 5/2014 | Goswami | |
| 2014/0367630 | A1 | 12/2014 | Asano | |
| 2015/0243883 | A1* | 8/2015 | Swaminathan | H01J 37/32192 118/723 R |
| 2021/0210682 | A1 | 7/2021 | Cheng | |
| 2023/0045290 | A1* | 2/2023 | Lee | H10B 61/10 |
| 2023/0422642 | A1* | 12/2023 | Chang | H01H 37/46 |

FOREIGN PATENT DOCUMENTS

| | | | |
|---|---|---|---|
| CN | 103296201 | A | 9/2013 |
| CN | 106206639 | A | 12/2016 |
| CN | 106206938 | A | 12/2016 |
| CN | 109841732 | A | 6/2019 |
| DE | 102008032067 | A1 | 1/2009 |
| DE | 112023003092 | T5 | 6/2025 |
| GB | 2635490 | A | 5/2025 |
| KR | 10-0650724 | B1 | 11/2006 |
| WO | 2024/060645 | A1 | 3/2024 |

OTHER PUBLICATIONS

Burr et al., "Recent Progress in Phase-Change Memory Technology," IEEE Journal on Emerging and Selected Topics in Circuits and Systems, vol. 6, No. 2, Jun. 2016, pp. 146-162.

Min et al., "18nm FDSOI Technology Platform embedding PCM & Innovative Continuous-Active Construct Enhancing Performance for Leading-Edge MCU Applications", International Electron Devices Meeting (IEDM), 2021, 4 pages, DOI: 10.1109/IEDM19574.2021.9720542.

Intellectual Property Office, Patents Act 1977: Examination Report under Section 18(3), Apr. 8, 2025, 7 Pages, GB Application No. 2504146.8.

Intellectual Property Office, Patents Act 1977: Search Report under Section 17(5), Jul. 30, 2025, 6 Pages, GB Application No. 2504146.8.

Intellectual Property Office, "Reply to Examination Report", Jul. 8, 2025, 03 Pages, GB Application No. 2504146.8.

Intellectual Property Office, Patents Act 1977: Examination Report under Section 18(3), Nov. 25, 2025, 07 Pages, GB Application No. 2504146.8.

German Patent and Trademark Office, "Office Action," Dec. 22, 2025, 04 Pages, DE Application No. 112023003092.8.

* cited by examiner 800
116
116
110
110
304
304
112
106
106
106
108
108
104

PHASE CHANGE MEMORY CELL SIDEWALL HEATER

BACKGROUND OF THE INVENTION

The present invention relates generally to the field of integrated circuits, and more particularly to phase change memory cell structures.

Phase change materials are capable of being switched between a first structural state in which the material is in a generally amorphous solid phase, and a second structural state in which the material is in a generally crystalline solid phase in the active region of the cell. The term amorphous is used to refer to a relatively less ordered structure, more disordered than a single crystal, which has detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material may be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as reset herein, is generally a higher current operation, which includes a short high current density pulse to melt or breakdown the crystalline structure, after which the phase change material cools quickly, quenching the phase change process, and thereby allowing at least a portion of the phase change structure to stabilize in the amorphous state. It is desirable to minimize the magnitude of the reset current used to cause the transition of phase change material from a crystalline state to an amorphous state. The magnitude of the needed reset current can be reduced by reducing the volume of the active region in the phase change material element in the cell. Techniques used to reduce the volume of the active region include reducing the contact area between electrodes and the phase change material, so that higher current densities are achieved in the active volume, with small absolute current values through the phase change material element.

SUMMARY

According to one embodiment of the present invention, a phase change memory structure with improved sidewall heater is provided. The phase change memory element structure includes a bottom electrode, a phase change material layer, a bilayer dielectric; and a side wall heater with an upper section and a lower section. The upper section of the sidewall heater extends vertically through the bilayer dielectric to contact the phase change material layer and the lower section of the sidewall heater has a plurality of conductive layers in contact with the bottom electrode and wherein a dimension of the upper section of the sidewall heater in contact with the phase change material layer is substantially smaller than a dimension of lower section of the sidewall heater in contact with the bottom electrode, resulting in an inverted T-shape.

According to another embodiment of the present invention, a method of forming an improved phase change memory cell sidewall is disclosed. The method includes forming a plurality of bottom electrodes on a semiconductor substrate. The method further includes depositing a bilayer dielectric, wherein the bilayer dielectric is in contact with at least two of the plurality of bottom electrodes, and the bilayer dielectric is comprised of at least a top oxide layer. Additionally, the method includes depositing a conformal multistack layer of sidewall heater metal. Further, the method includes depositing a conformal dielectric liner layer over the conformal multistack layer of sidewall heater metal. The method can also include removing a horizontal surface of conformal dielectric liner layer and conformal multistack layer of the sidewall heater metal. Furthermore, the method can include removing a portion of the top oxide layer into two or more segments. Additionally, the method can include removing a horizontally exposed multistack layer of sidewall heater metal to be horizontal with respective contacting bilayer dielectric. The method can also include, removing the top oxide layer. Furthermore, the method can include depositing an upper dielectric layer. The method can also include exposing a horizontal surface of the multistack sidewall heater metal. The method can include depositing a phase change material. Additionally, the method can include depositing a top electrode material. The method may also include forming two or more phase change material elements.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
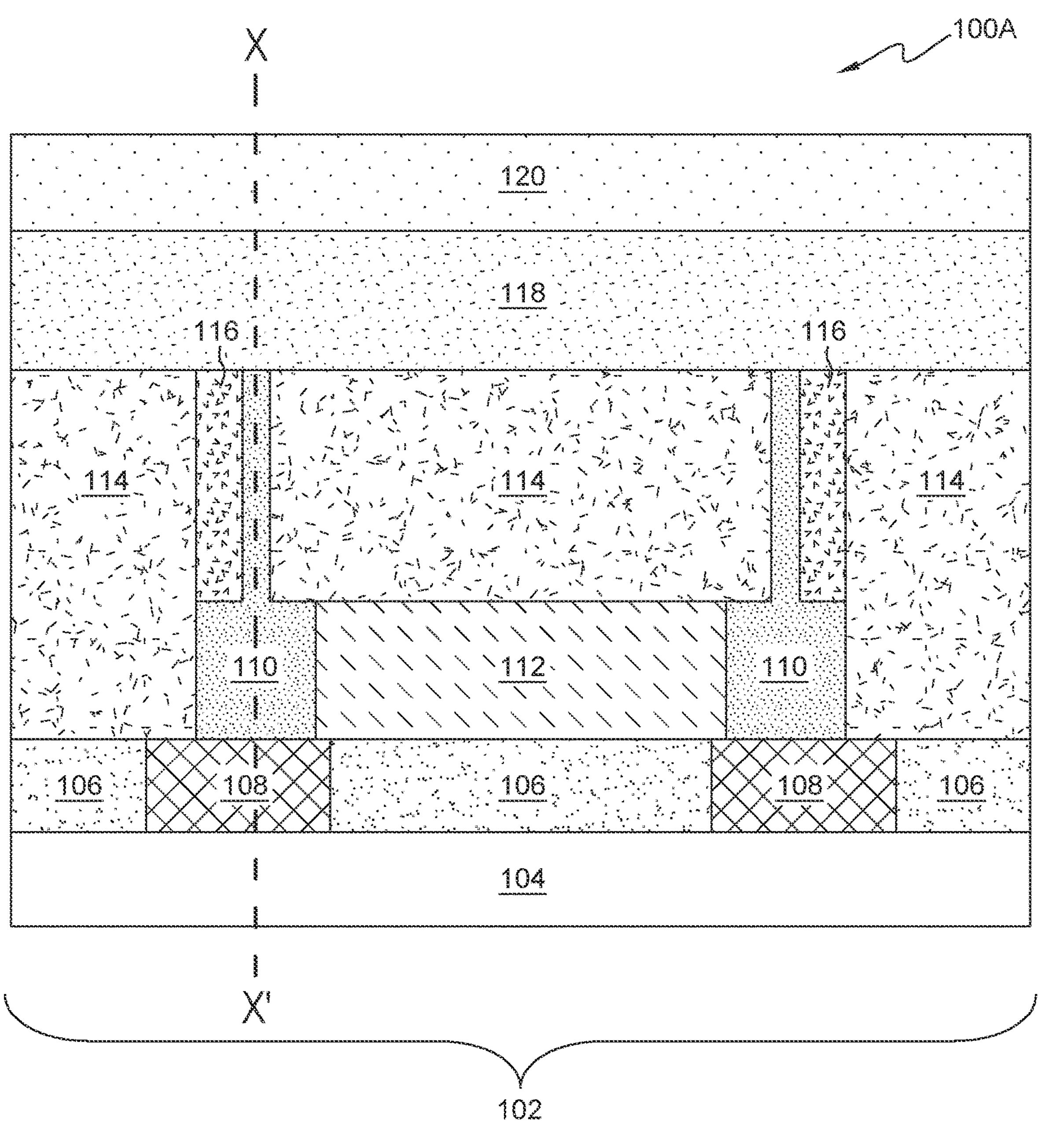
FIGS. 1A and 1B illustrate a cross-sectional view of a phase change memory cell 102 of FIG. 1A, generally designated 100A, is a cross section of FIG. 1B in the Y-Y' plane and FIG. 1B, generally designated 100B, is a cross section of FIG. 1A in the X-X' plane, in accordance with at least one embodiment of the present invention.

The present invention relates generally to the field of integrated circuits, and more particularly to phase change memory cell sidewall heaters.

Phase change memory (PCM) is an emerging non-volatile random-access memory which has benefits over existing non-volatile memory technology. PCM provides numerous advantages for both classic memory applications and neuromorphic computing applications. Put simply, PCM has two basic forms: a crystalline structure with low electrical resistance and an amorphous structure with high electrical resistance. When PCM is heated for a short period and allowed to cool quickly, it achieves the amorphous state. To achieve the crystalline state, the PCM is heated at a lower temperature for a longer period and cooled slowly, relative to the amorphous state.

Current PCM devices achieve a programmable state through a reset procedure utilizing sidewall heaters. The sidewall heaters have a relatively thin sublithographic dimension in contact which the PCM material, however the sidewall heater dimension parallel to the contact is generally the same dimension as the top electrode of the memory cell. This results in a large contact area between the sidewall heater and the PCM.

Embodiments of the present invention improve upon the deficiencies of current PCM reset steps, and the resulting structures thereof, by forming a sidewall heater with a reduced area at the top of the sidewall heater in contact with the PCM and a reduced thermal conductivity between the side wall heater and the PCM due to a large area of the bottom of the side wall heater in contact with dielectric layers.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of phase change memory structure fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The Figures represent cross-section portions of various semiconductor structures and sub-assembly structures, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

The present invention will now be described in detail with reference to the Figures, wherein like reference numerals refer to like elements throughout. FIGS. 1-12 include various cross-sectional views depicting illustrative steps of a method, and the resulting structures thereof, for manufacturing semiconductor devices, and in particular, a phase change memory structure with improved sidewall heaters, according to select embodiments of the present invention. One having ordinary skill in the art will appreciate that there are many options available for the formation of the structures described herein and that the following discussion does not limit embodiments to only the techniques described herein.

Figure 1B:
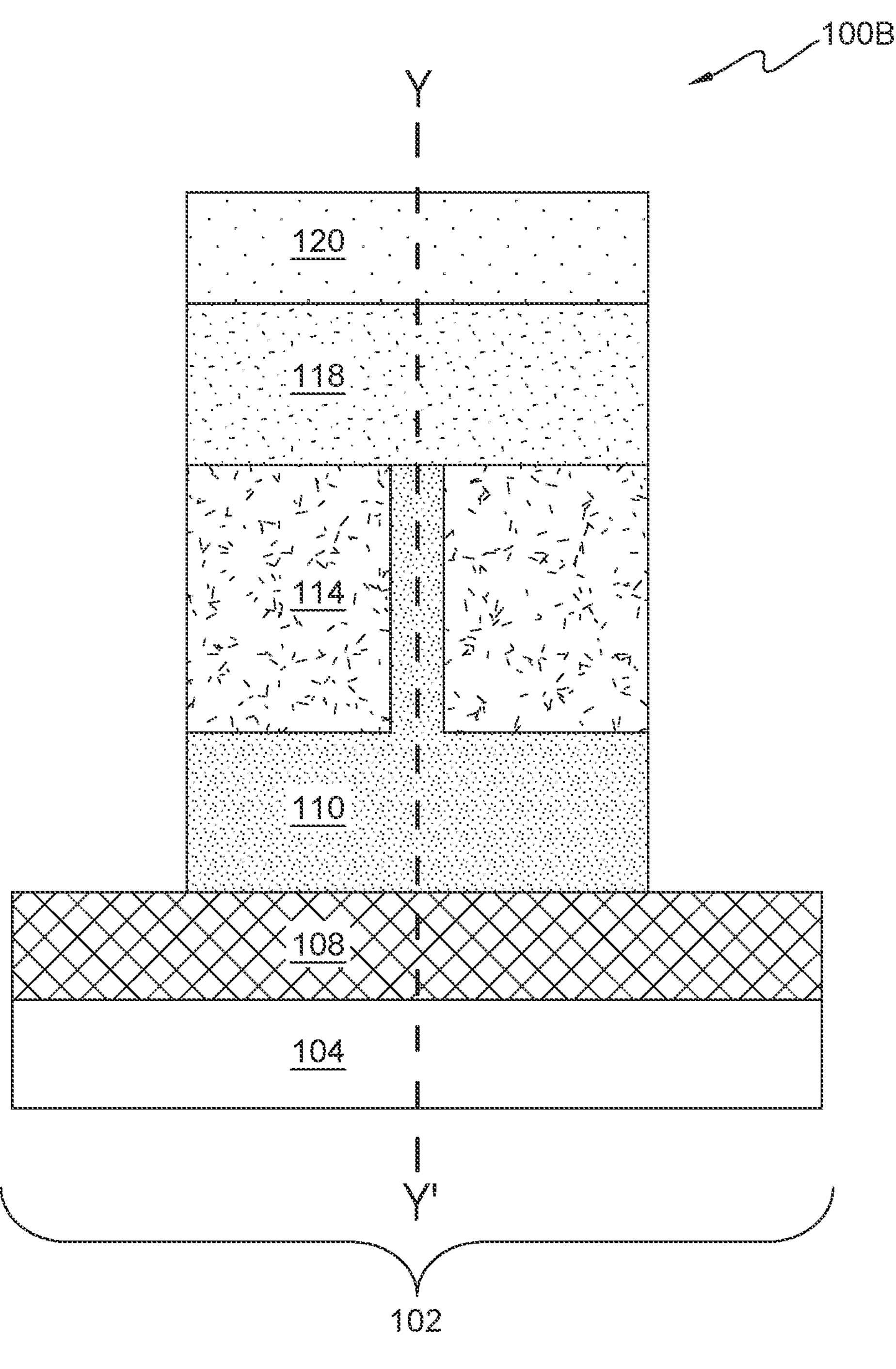

With reference to FIG. 1A and FIG. 1B, structure 100A and structure 100B depict various views of a PCM structure comprising a PCM cell 102 with an improved sidewall heater 110 in contact with a phase change element (PCE) 118, in accordance with at least one embodiment of the present invention. It should be understood that FIG. 1A and FIG. 1B are to be used in conjunction with one another but are non-limiting examples of at least one embodiment of the present invention. FIG. 1A is a cross sectional view taken along line Y-Y' of FIG. 1B and FIG. 1B is a cross sectional view along line X-X' of FIG. 1A.

As illustrated by the cross-sectional view of structure 100A of FIG. 1A, the PCM cell 102 comprises semiconductor substrate 104, interlayer dielectric 106, bottom electrode 108, sidewall heater 110, base layer dielectric 112, PCE layer dielectric 114, heater layer dielectric 116, PCE 118, and top electrode 120. For ease of understanding, FIG. 1A will be described in a bottom up manner, describing the components of PCM cell 102 in relation to one another.

Semiconductor substrate 104 can be a base upon which the PCM structure is fabricated. Semiconductor substrate 104 can be any suitable substance such as silicone, metal oxide, gallium arsenide and the like. In an embodiment, semiconductor substrate 104 can have pre-built devices integrated on the substrate itself. Examples of pre-built devices may include, but are not limited to transistors, (e.g., field-effect transistors), resistors, capacitors, etc.

Overlying semiconductor substrate 104 is bottom electrode 108 surrounded by interlayer dielectric 106. Bottom electrode 108 and top electrode 120 are conductive and can be made from a metal such as, for example, titanium (Ti), vanadium (V), chromium (Cr), manganese (Mn), iron (Fe), cobalt (Co), nickel (Ni), silver (Ag), gold (Au), aluminum (Al), copper (Cu), tungsten (W), molybdenum (Mo) and alloys, such as tungsten nitride (WN), tungsten carbide (WC), or multilayered stacks thereof. Further bottom electrode 108 and top electrode 120 may be wires, vias, or a combination of the two.

As shown in FIG. 1A, base layer dielectric 112 overlies interlayer dielectric 106 and bottom electrode 108. Base layer dielectric 112 is in between sidewall heater element 110. Side wall heater 110 overlies bottom electrode 108 and is in contact with PCE layer dielectric 114 on the each respective exterior side. Side wall heater element 110 is also in electrical contact with bottom electrode 108.

Overlying PCE layer dielectric 114 is PCE 118. PCE 118 can be composed of germanium-antimony-tellurium (GeSbTe also known as GST) or a germanium-tellurium compound material (GeTe). Alternatively, other suitable materials for PCE 118 can include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys combinations thereof, or another other phase-change material suitable for use in a PCM device. PCE 118 may be undoped or doped (e.g., doped with one or more of O, N, Si, or Ti). PCE 118 also overlies and is in contact with sidewall heater 110 and heater dielectric 116. Overlying PCE 118 is top electrode 120.

The dimension of sidewall heater 110 in contact with PCE 118 can be controlled by the thickness of the film used to deposit the sidewall heater metal during fabrication (e.g., 3 nm, 4 nm, 5 nm, etc.). In an embodiment, sidewall heater 110 can be one or more layers of metallic material suitable for thermal and electrical conductance. In an embodiment, the sidewall heater 110 can be two or more alternating layers of TiN and TaN.

Referring to FIG. 1B, generally designated structure 100B, is a view of PCM cell 102 taken along the X-X' axis of FIG. 1A. FIG. 1B illustrates bottom electrode 108 overlying semiconductor substrate 104. Overlying bottom electrode 108 is sidewall heater 110. As shown in FIG. 1B, sidewall heater 110 has a portion forming a column with a dimension substantially thinner than the base portion. The column portion extends upward with PCE dielectric layer 114 in contact on either side of the column portion. The column portion terminates at PCE 118, which overlies the termination point of the column section of sidewall heater 110 and PCE dielectric 114. That being said PCE 118 is in contact with PCE dielectric 114 and sidewall heater 110. Overlying PCE 118 is top electrode 120.

Figure 2:
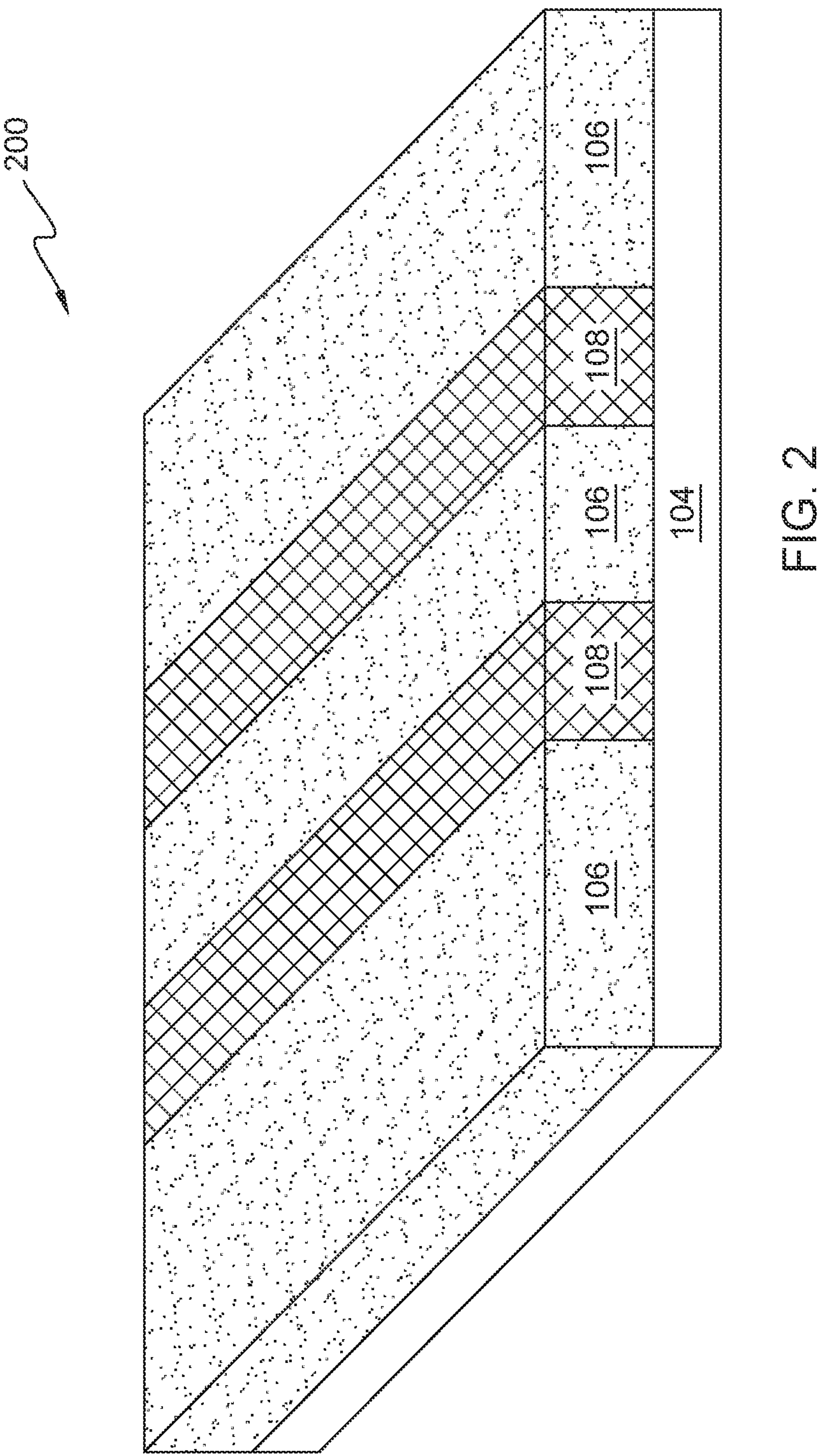
FIGS. 2-12 illustrate steps in a fabrication sequence for manufacturing a dual cell phase change memory structure, in accordance with at least one embodiment of the present invention.

Referring now to FIGS. 2-12, FIGS. 2-12 illustrates the steps of a fabrication sequence of a dual cell phase change memory structure, in accordance with at least one embodiment of the present invention. It should be noted, while a dual cell PCM structure is shown, the steps shown in the figures can be scaled to fabricate a memory structure with any number of PCM cells (e.g., 3, 4, n . . . n+1). FIG. 2 shows forming bottom electrode 108 on semiconductor substrate 104 in strips and depositing interlayer dielectric 106 around the strips of bottom electrode 108 surrounding both sides of bottom electrode 108, while leaving the upper horizontal portion of bottom electrode 108 exposed, resulting in structure 200. Alternatively, the bottom electrode 108 can also be formed, for example, by a conventional complementary metal-oxide-semiconductor (CMOS) back-end-of-line (BEOL) damascene process (e.g., tungsten, cobalt, or copper surrounded by interlayer dielectric 106).

Figure 3:
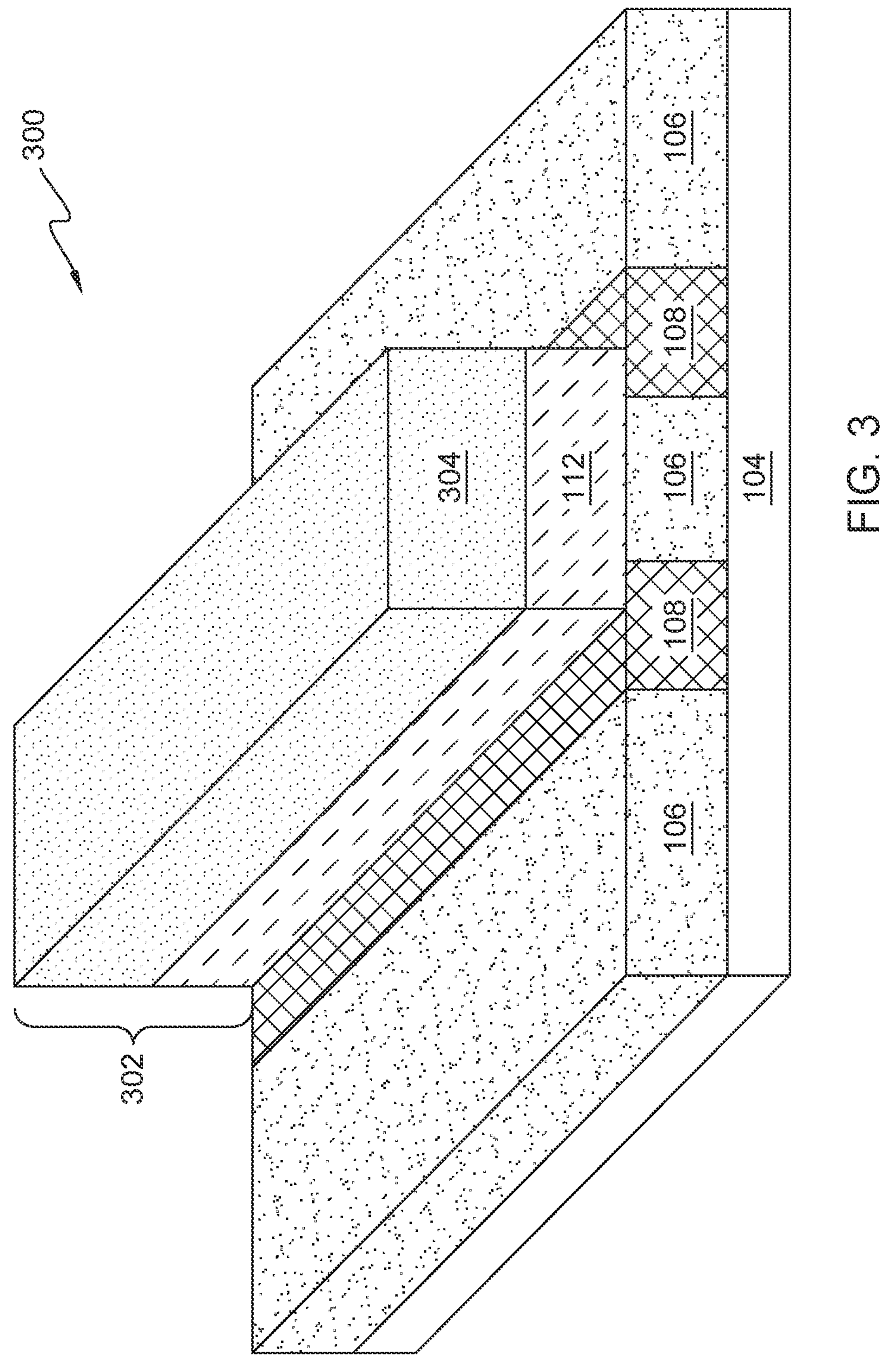

FIG. 3 shows structure 300 after depositing a bilayer dielectric 302 composed of base layer dielectric 112 and etching oxide dielectric layer 304 (e.g., pattern formation) on the center portion of interlayer dielectric 106 and covering roughly half of the median portion of bottom electrode 108 on the previous structure. Bilayer dielectric 302 is a dielectric material that can be composed of two substances with a nitride underlayer (SiN) and an oxide layer ($SiO_2$). Etching oxide dielectric layer 304 is a dielectric material that provides a scaffolding and protection for sidewall heater 110 during the fabrication process. Etching oxide dielectric layer 304 can be composed of suitable dielectric oxide material (e.g., $SiO_2$).

Figure 4:
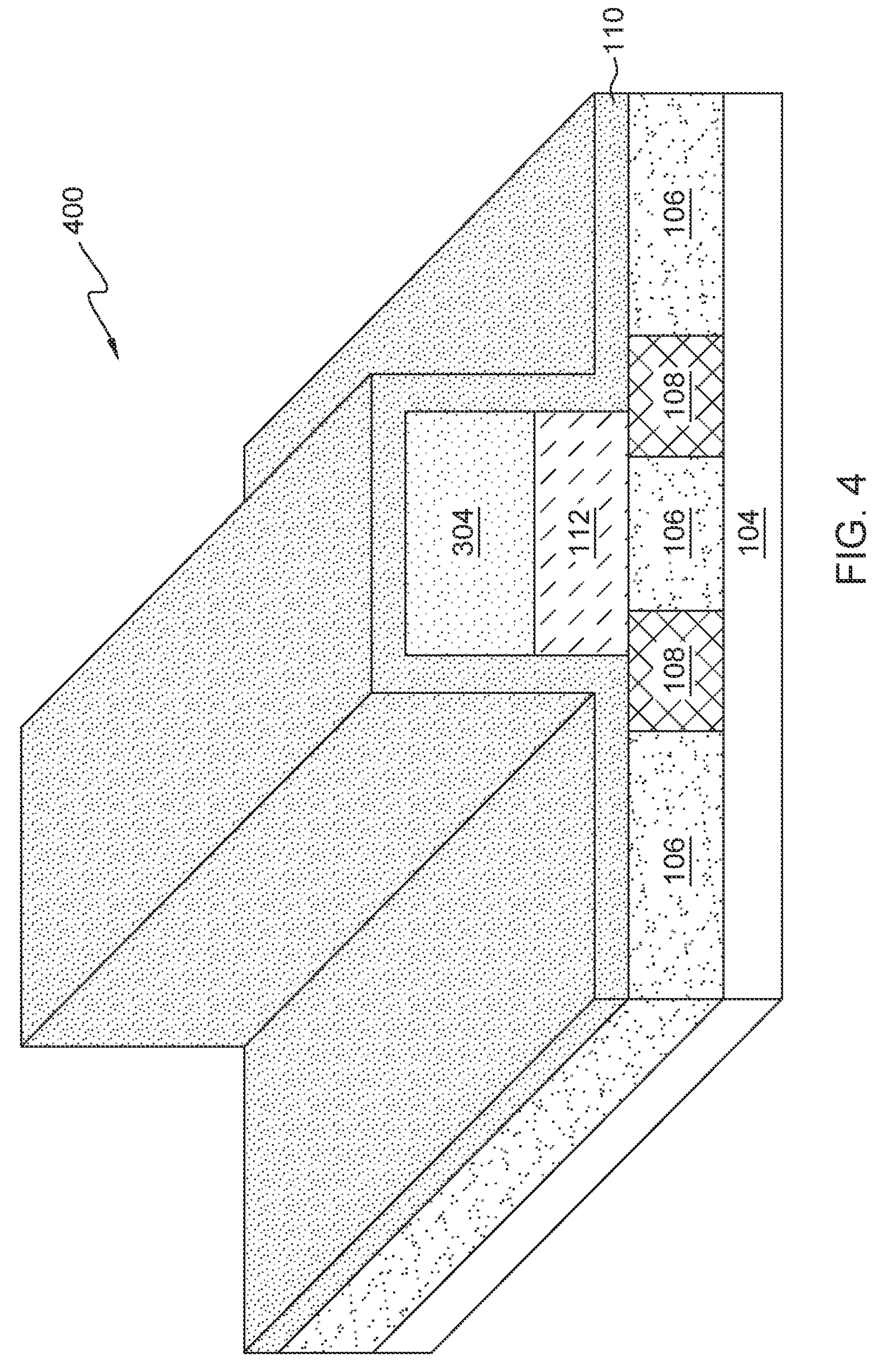

FIG. 4 shows structure 400, including a conformal metal layer of sidewall heater material 110 deposited on the previous structure 300. In an embodiment, the conformal metal layer of sidewall heater material 110 (e.g., TiN, TaN, TiAlN, TiSiN, TaAlN, TaSiN) can be deposited in multiple layers forming a multilayer stack. The multiplayer multilayer stack can be two or more alternating layers of varying thickness (e.g., 3 nm TaN/5 nm TiN, 3 nm TaN/3 nm TiN). Thickness of the multilayer stack can be dependent upon the thickness of the conformal metal layer of sidewall heater material 110 during the fabrication process. In another embodiment, a conformal multilayer stack of alternating sidewall heater material can be 5 layers thick comprising: 3 nm TaN, 5 nm TiN, 3 nm TaN, 3 nm TiN, 3 nm TaN. It should be noted that the layer numbers and layer thickness are not limited to the above examples. This deposition of the multilayer stack of the conformal metal layer of sidewall heater material 110 will provide three layers of multilayer stack heater material in contact with PCE 118 in the final phase change structure.

Figure 5:
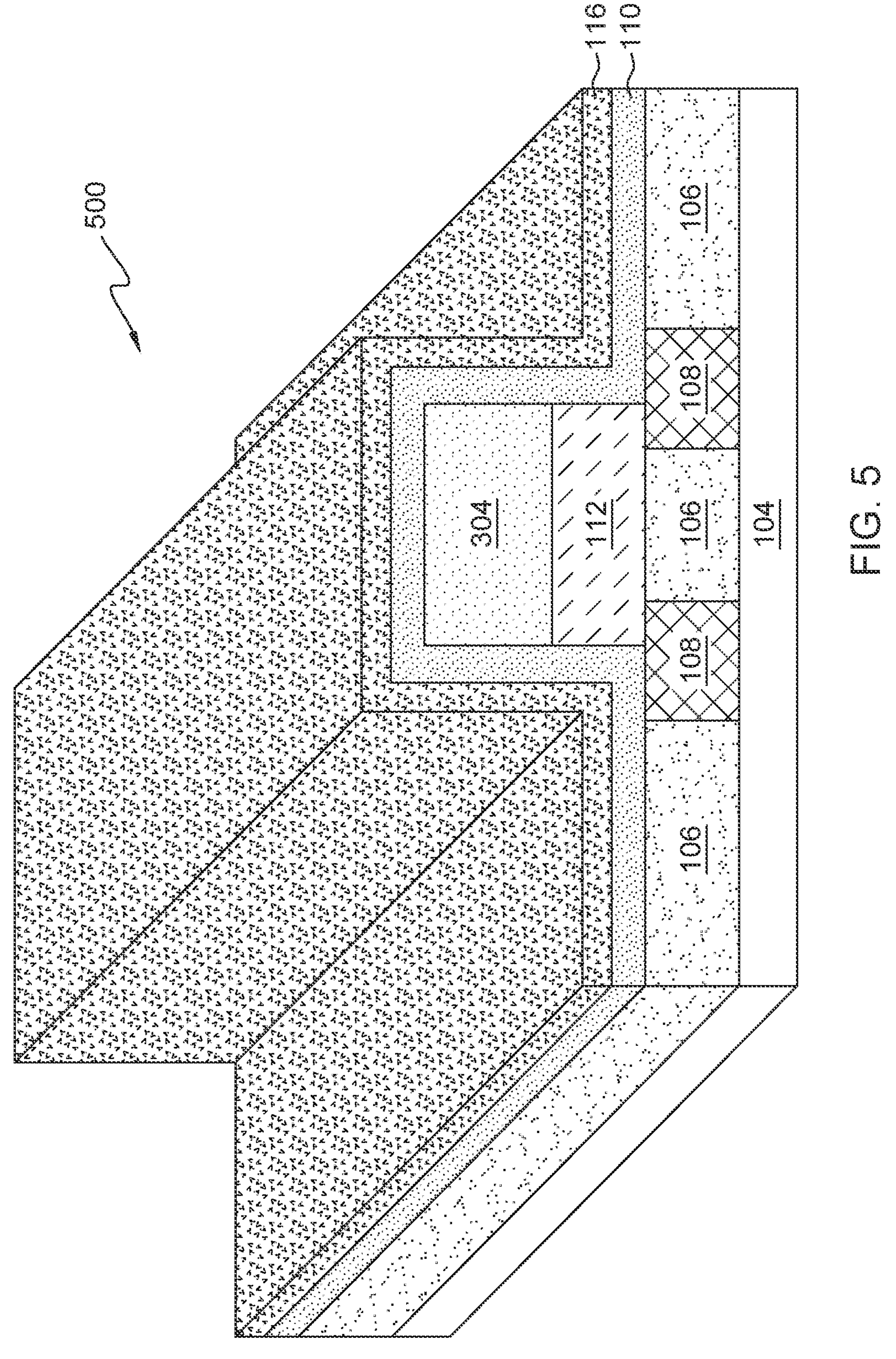

FIG. 5 shows structure 500, including the result of depositing a conformal layer of sidewall heater dielectric 116 on the previous structure 400. Sidewall heater dielectric 116 can be composed of a nitride dielectric material (e.g., SiN) and can protect the lower multilayer stack of conformal metal layer of sidewall heater material 110 previously deposited on structure 400.

Figure 6:
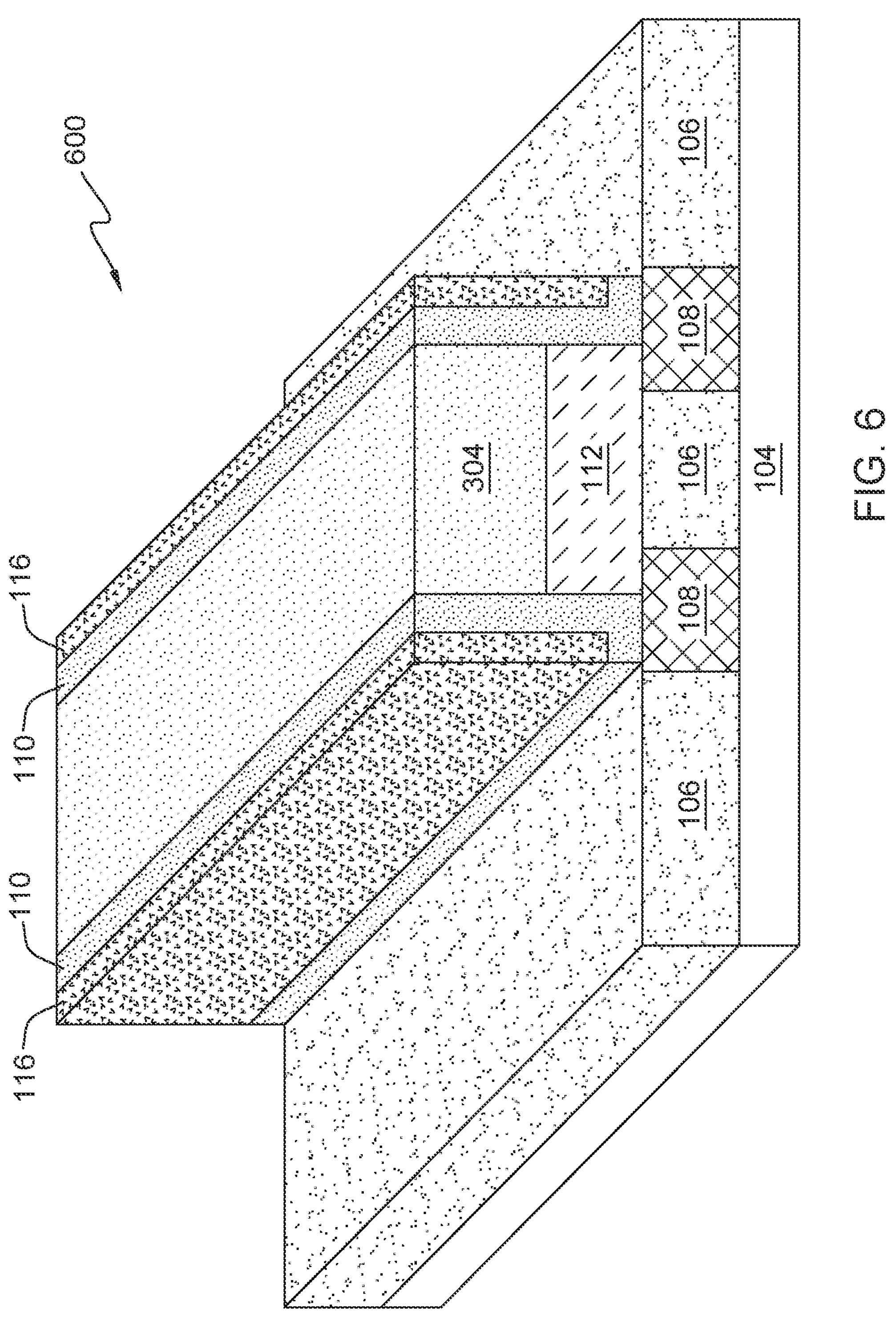

FIG. 6 shows structure 600, including the removal of a portion of the conformal sidewall heater material 110 and conformal layer of sidewall heater dielectric 116 on the horizontal surfaces of structure 500. In an embodiment, an etching process (e.g., reactive ion etch) can be performed to remove material (e.g., sidewall heater dielectric 116) along structure 500 on horizontal surfaces. A roughly equivalent amount of material can be removed on the horizontal surfaces exposing an upper portion of interlayer dielectric 106, a portion of the horizontal and vertical surface of sidewall heater 110, the horizontal portion of etching oxide layer 304, and the exterior vertical and horizontal upper portion of sidewall heater dielectric 116.

Figure 7:
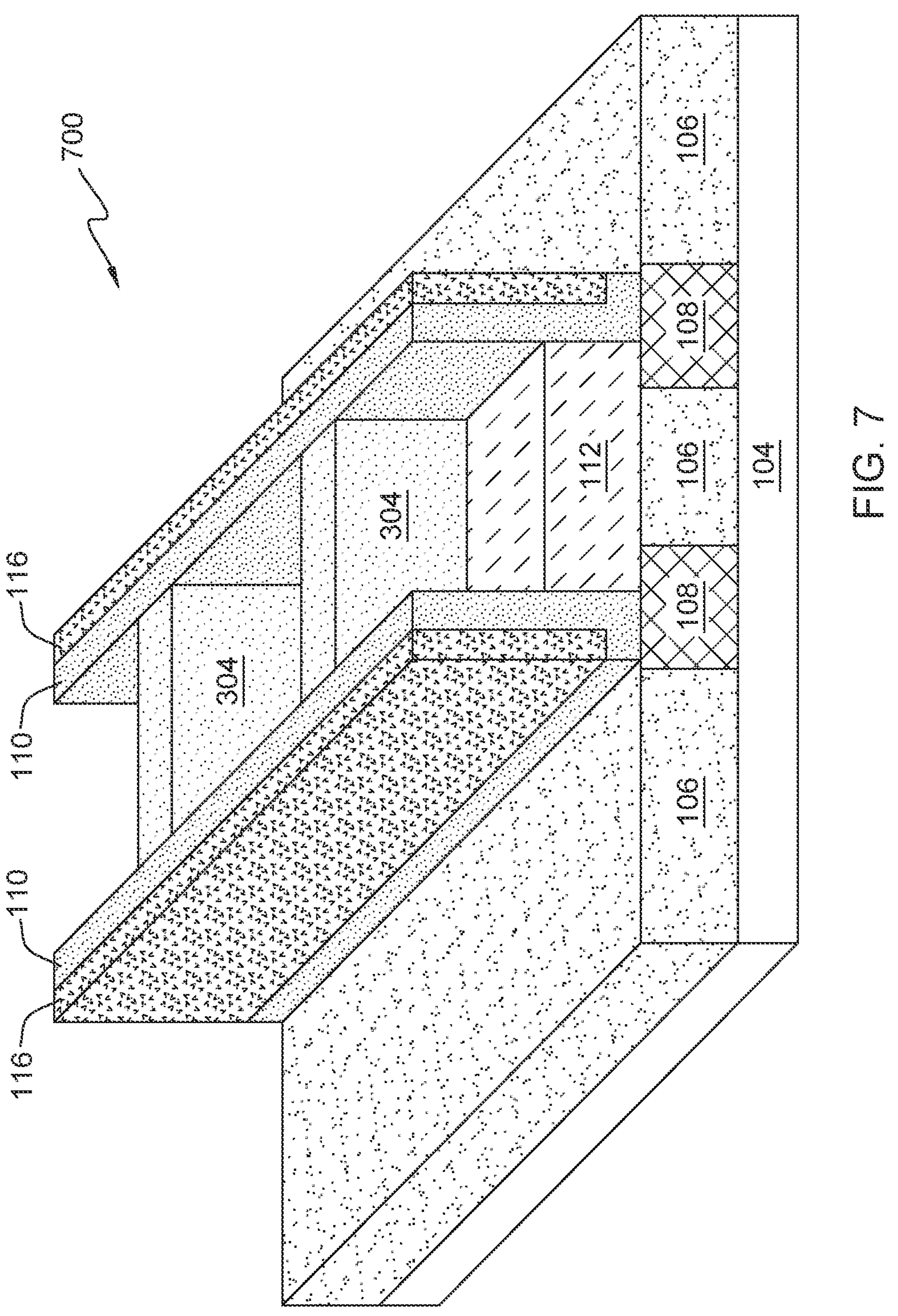

FIG. 7 shows structure 700, including cutting the etching oxide layer 304 into multiple segments. In an embodiment, structure 700 is achieved by utilizing a pattern mask, to cut etching oxide layer 304 into two distinct segments exposing the upper horizontal surface of bottom layer dielectric 112 and the interior vertical face of sidewall heater 110. In an embodiment, trimming etch oxide dielectric 304 can be performed via an isotropic etch to further narrow the two distinct segments.

Figure 8:
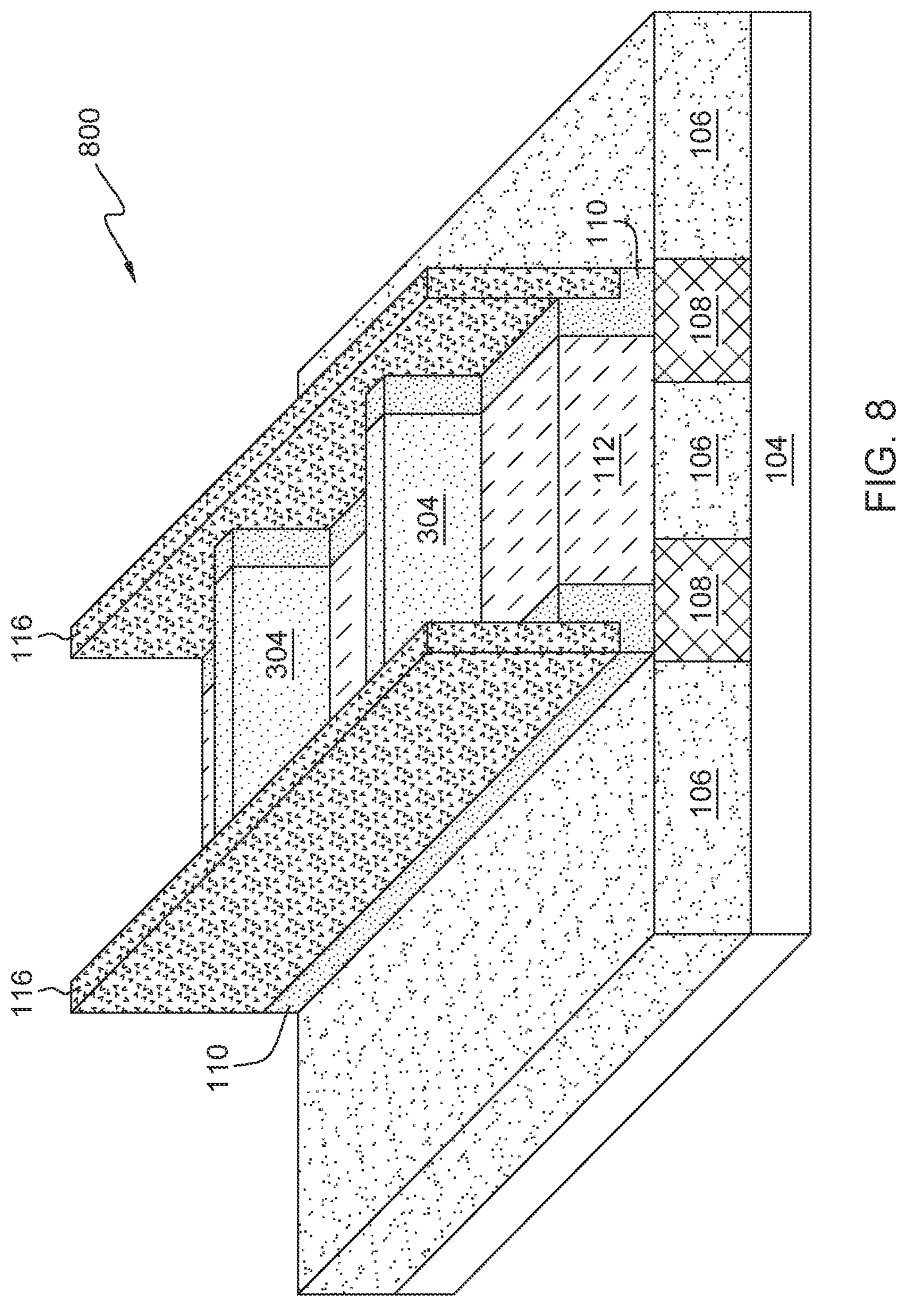

FIG. 8 shows structure 800. Structure 800 is achieved by removing sidewall heater material to be respectively horizontal with the upper portion of oxide etching dielectric 304 block structures and of bottom layer dielectric 112, while exposing the respective interior vertical face of sidewall dielectric 116 above oxide etch dielectric and 304 and base layer dielectric 112. In an embodiment, removing sidewall heater material can be accomplished by an isotropic etch (e.g., atomic layer etching).

Figure 9:
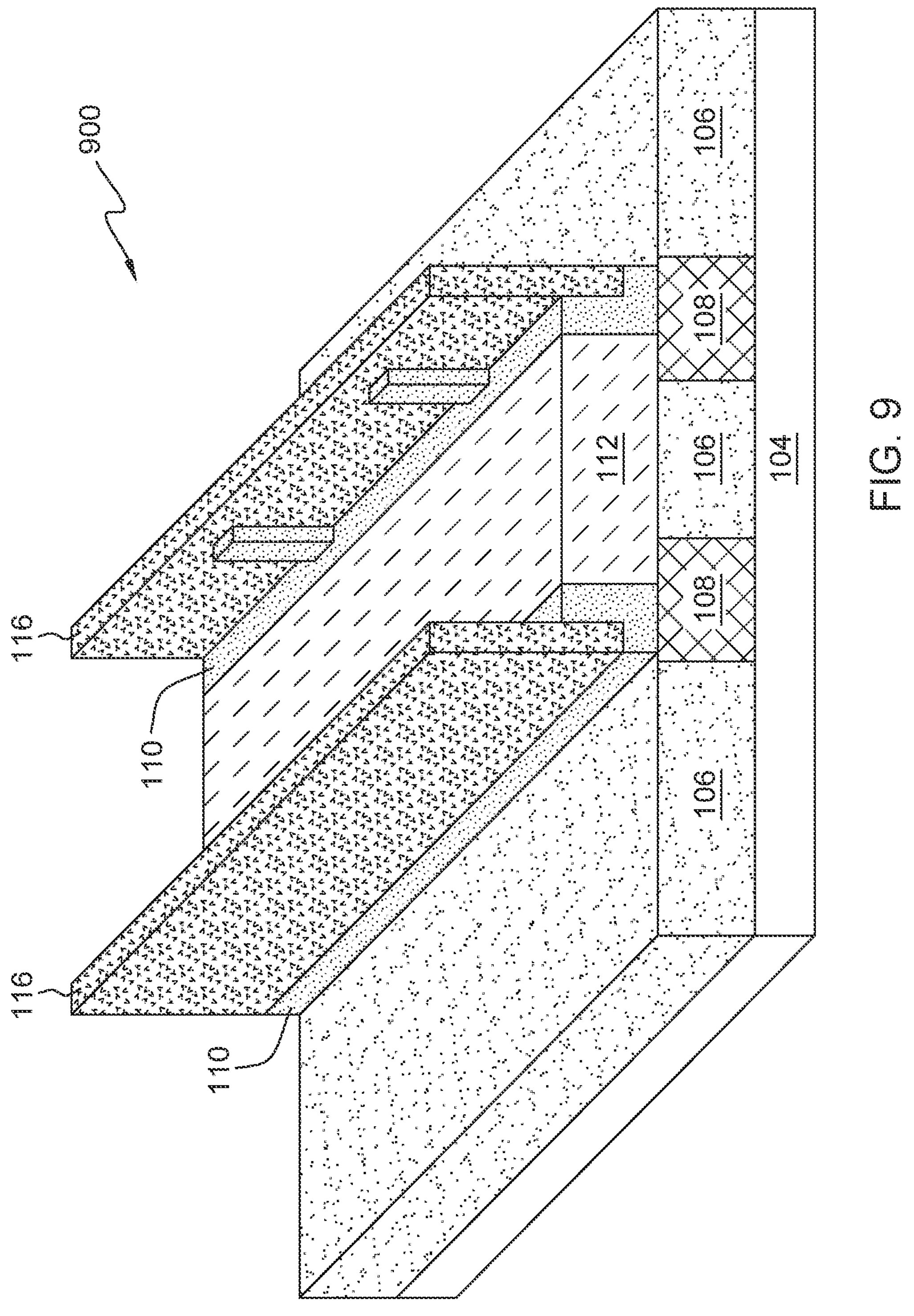

FIG. 9 shows structure 900. Structure 900 is achieved by removing both blocks of oxide etching dielectric 304 illustrated in FIG. 8. In an embodiment, the blocks of oxide etch dielectric 304 can be removed by performing a layer-by layer isotropic etch. In an embodiment, this exposes the interior medial face of sidewall heater 110. In an embodiment, a multilayer sidewall heater 110 is used with alternating materials. In such an embodiment, one or more layers of the vertical columnar portion of sidewall heater material can be removed. For example, if a sidewall heater 110 is comprised of four layer multilayers (i.e., a TaN/TiN/TaN/TiN composition) two of the layers can be removed. Leaving a two layer columnar vertical portion where one of the layers has an exposed medial interior face (e.g., the TiN layer) while the other layers are sandwiched between sidewall heater dielectric 116 and the exposed remaining layer of sidewall heater material. The exposed horizontal surface of this sandwiched layer can form the top of sidewall heater 110.

Figure 10:
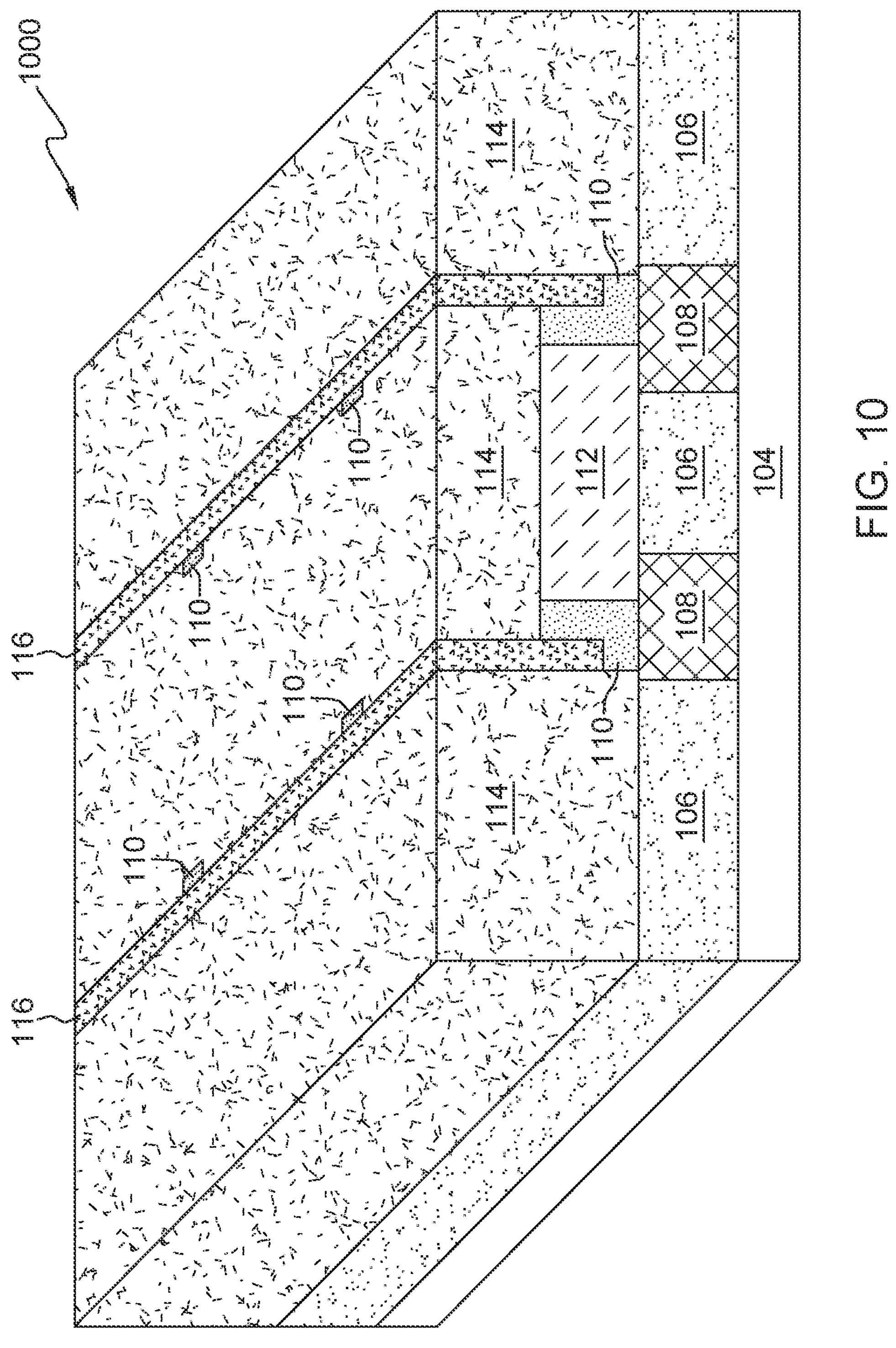

FIG. 10 shows structure 1000. Structure 1000 is achieved by depositing dielectric layer 114 on top of the exposed horizontal surfaces of structure 900 from FIG. 9 and performing CMP to remove material from the horizontal surface of structure 1000 to expose sidewall heater 110. In an embodiment, dielectric layer 114 can be $SiO_2$ or SiN material. In an embodiment, a layer of base layer dielectric 112 can be deposited prior to dielectric layer 114 on the horizontal and vertical surface of structure 900 to prevent possible oxidation of bottom electrode 108 and sidewall heater 110. In an embodiment, a thin base layer dielectric 112 can be deposited followed by a layer deposition of dielectric layer 114, then a portion of base layer dielectric 112 and the dielectric layer 114 can be removed via a CMP to expose the uppermost horizontal surface of sidewall heater 110 that will be in contact with a phase change material.

Figure 11:
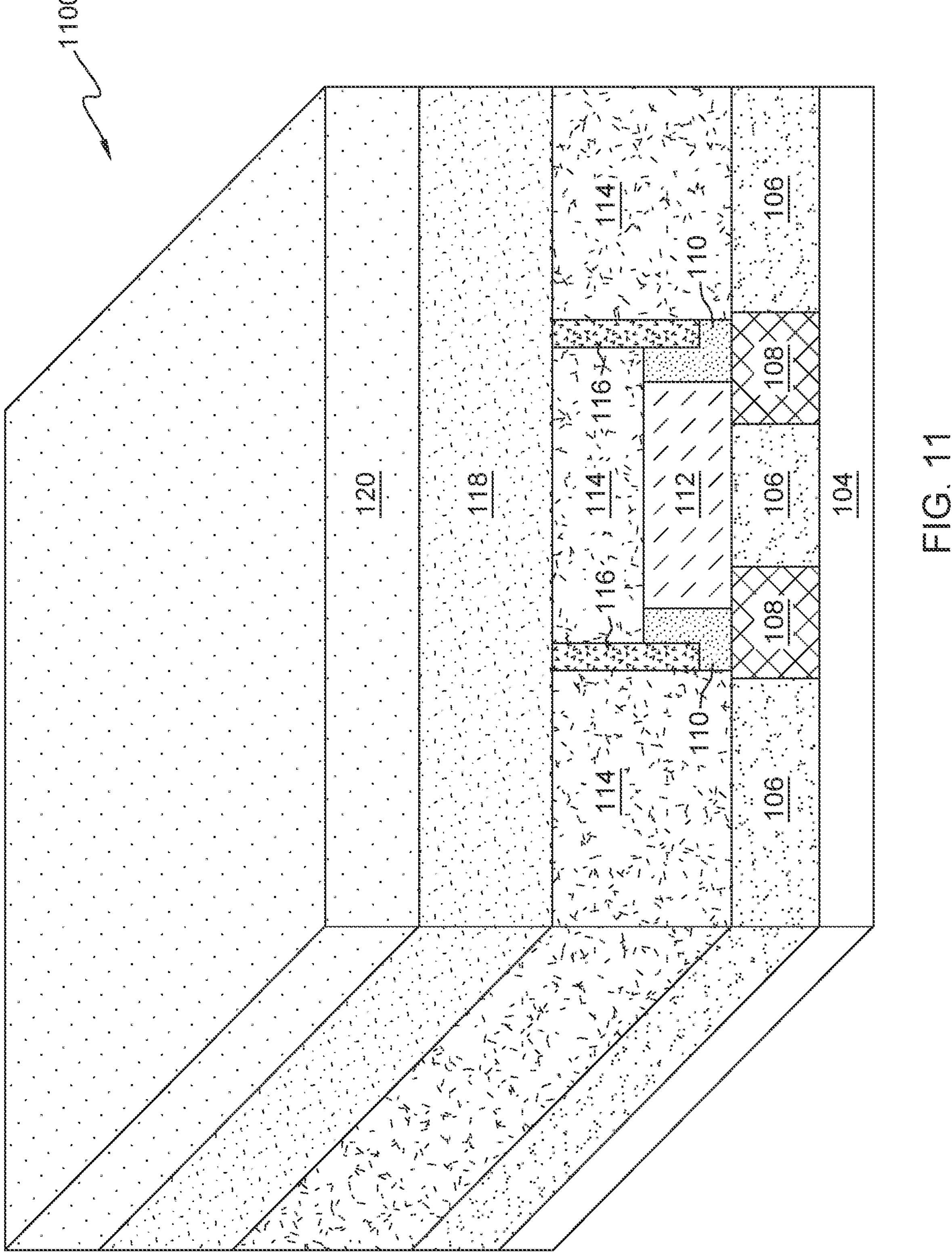

FIG. 11 shows structure 1100. Structure 1100 is achieved by first depositing phase change element 118 (e.g., GST) followed by a top electrode material. Phase change element 118 is deposited on top of structure 1000. Phase change element 118 is deposited on the top horizontal planar surface of PCE layer dielectric 114, the top horizontal surface of heater layer dielectric and the topmost portion of the horizontal surface of sidewall heater 110. In an embodiment, the upper surface of phase change element 118 can be flattened to be parallel with its' bottom horizontal surface. A top electrode 120 can be deposited on the upper horizontal surface of phase change element 118 to form top electrode 120. Top electrode 120 can be composed of one or more materials capable of conducting an electric current (e.g., TiN, W, Cu, Al, etc.).

Figure 12:
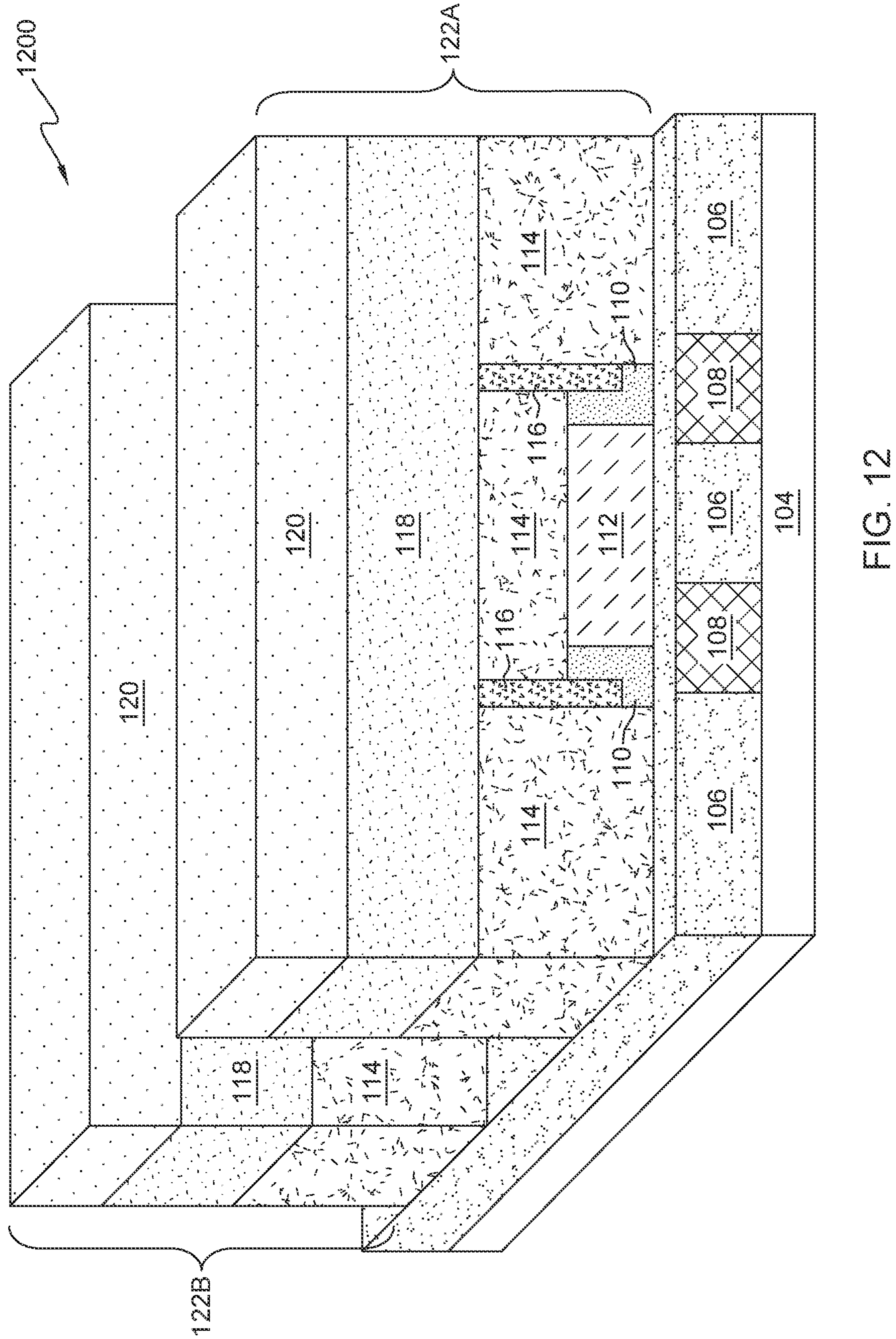

FIG. 12 shows structure 1200 after dividing or sectioning structure 1100 of FIG. 11 into two separate phase change memory cells. Structure 1200 is achieved by patterning top electrode 120 and phase change memory element 118 into 2 separate blocks. Further, in an embodiment, an etching process is performed removing any remaining material previously covered by phase change memory element 118 down to the interlayer dielectric layer 106 and bottom electrode 108, resulting in two separate phase change memory cells 122A and 122B. In an embodiment, a dielectric material (not shown) can be deposited around phase change memory cells 122A and 122B and on top of now exposed interlayer dielectric 106 and bottom electrode 108, further ensuring separation between phase change memory cells 122A and 122B and insulating them from stray current. It should be noted, while only two phase change memory cells 122A and 122B are shown in FIG. 12, numerous memory cells (e.g., 2, 3, n . . . n+1) can be fabricated via the method illustrated in FIGS. 2-12. A phase change memory cell can be arranged in any array known in the art and used as a form of memory (e.g., volatile or non-volatile) in a computing device.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A phase change memory element structure, comprising:
- a bottom electrode;
- a phase change material layer;
- a bilayer dielectric, including a base layer dielectric and a phase change element layer dielectric located on top of the base layer dielectric; and
- a sidewall heater with an upper section and a lower section, wherein the upper section extends vertically through the phase change element layer dielectric of the bilayer dielectric to contact the phase change material layer and the lower section of the sidewall heater has a plurality of conductive layers in contact with the bottom electrode, and wherein a dimension of the upper section of the sidewall heater in contact with the phase change material layer is substantially smaller than a dimension of the lower section of the sidewall heater in contact with the bottom electrode, resulting in an inverted T-shape, wherein the sidewall heater is composed of a multilayer stack of metal including alternating layers of at least two materials selected from the group consisting of TiN, TaN, TaAlN, TiSiN, TiAlN, and TaSiN.

2. The phase change memory element structure of claim 1, wherein the phase change memory element structure is formed on a semiconductor substrate.

3. The phase change memory element structure of claim 1, wherein a configuration of the multilayer stack of metal is selected from the group consisting of 3 nm TaN/5 nm TiN and 3 nm TaN/3 nm TiN.

4. The phase change memory element structure of claim 1, wherein the bilayer dielectric is comprised of a bottom layer of dielectric of SiN and a top layer of dielectric $SiO_2$.

5. The phase change memory element structure of claim 1, wherein the phase change material layer is comprised of a chalcogenide glass.

6. The phase change memory element structure of claim 5, wherein the chalcogenide glass is germanium-antimony-tellurium ("GST").

7. A phase change memory element structure, comprising:
- a bottom electrode;
- a phase change material layer;
- a bilayer dielectric, including a base layer dielectric and a phase change element layer dielectric located on top of the base layer dielectric; and
- a sidewall heater with an upper section and a lower section, wherein the upper section extends vertically through the phase change element layer dielectric of the bilayer dielectric to contact the phase change material layer and the lower section of the sidewall heater has a plurality of conductive layers in contact with the bottom electrode and wherein a width of the upper section of the sidewall heater in contact with the phase change material layer is substantially smaller than a width of the lower section of the sidewall heater in contact with the bottom electrode, wherein the sidewall heater is composed of a multilayer stack of metal including alternating layers of at least two materials selected from the group consisting of TiN, TaN, TaAlN, TiSiN, TiAlN, and TaSiN.

8. The phase change memory element structure of claim 7, wherein the upper section of the sidewall heater is comprised of a single layer of conductive material.

9. The phase change memory element structure of claim 7, further comprising a SiN liner surrounding the sidewall heater with an exception of a portion in contact with the phase change material layer.

* * * * *